US009859525B2

(12) United States Patent
Hsieh et al.

(10) Patent No.: US 9,859,525 B2
(45) Date of Patent: Jan. 2, 2018

(54) FLEXIBLE DISPLAY SUBSTRATE AND METHOD FOR MANUFACTURING THE SAME

(71) Applicant: BOE TECHNOLOGY GROUP CO., LTD., Beijing (CN)

(72) Inventors: Ming-Che Hsieh, Beijing (CN); Chunyan Xie, Beijing (CN); Lu Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/378,032

(22) Filed: Dec. 13, 2016

(65) Prior Publication Data

US 2017/0092895 A1    Mar. 30, 2017

Related U.S. Application Data (63) Continuation of application No. 14/436,725, filed as application No. PCT/CN2014/074216 on Mar. 27, 2014, now Pat. No. 9,553,135.

(30) Foreign Application Priority Data

Feb. 11, 2014   (CN) .......................... 2014 1 0048621

(51) Int. Cl.
*H01L 51/52* (2006.01)
*H01L 51/00* (2006.01)
(Continued)

(52) U.S. Cl.
CPC ...... *H01L 51/5253* (2013.01); *H01L 27/3244* (2013.01); *H01L 51/0097* (2013.01);
(Continued)

(58) Field of Classification Search
CPC ............. H01L 51/5253; H01L 51/0097; H01L 27/124; H01L 27/1214; H01L 27/1244;
(Continued)

(56) References Cited

U.S. PATENT DOCUMENTS 9,285,647 B2    3/2016   Chen et al.
2002/0030189 A1*  3/2002   Ishikawa ............... G02F 1/1368
                                                                 257/59
(Continued)

FOREIGN PATENT DOCUMENTS

CN    102664196 A    9/2012
CN    102856252 A    1/2013
(Continued)

OTHER PUBLICATIONS

English translation of the International Search Report and Written Opinion dated Sep. 29, 2014, for corresponding PCT Application No. PCT/CN2014/074216.
(Continued)

*Primary Examiner* — Caridad Everhart
(74) *Attorney, Agent, or Firm* — Kinney & Lange, P.A.

(57) ABSTRACT

Disclosed is a flexible display substrate and a method for manufacturing the same which can avoid break and peeling of film layers disposed on a flexible base and further reduce degree of a warpage occurred in the flexible base when separating the support substrate from the flexible base located above the support substrate. The flexible display substrate comprises the flexible base, a first buffer layer and a second buffer layer disposed on an upper surface and a lower surface of the flexible base, respectively, a plurality of display modules disposed on the first buffer layer, each display module includes at least one thin film transistor and at least one electrode corresponding to the thin film transistor, and a plurality of auxiliary thin film transistors disposed
(Continued)

on one side of the second buffer layer which is away from the flexible base, the auxiliary thin film transistors corresponding to the thin film transistors one by one, respectively.

9 Claims, 5 Drawing Sheets

(51) Int. Cl.
*H01L 51/56* (2006.01)
*H01L 27/32* (2006.01)

(52) U.S. Cl.
CPC ........ *H01L 51/56* (2013.01); *H01L 2227/323* (2013.01); *H01L 2251/5338* (2013.01)

(58) Field of Classification Search
CPC ... H01L 27/1262; H01L 51/56; H01L 51/097; H01L 27/1266; H01L 27/3244; H01L 2227/323; H01L 2227/326; H01L 2251/5338; G02F 1/13454
See application file for complete search history.

(56) References Cited

U.S. PATENT DOCUMENTS

| | | | |
|---|---|---|---|
| 2006/0108653 | A1 | 5/2006 | Koo et al. |
| 2006/0284179 | A1* | 12/2006 | Jung .................. H01L 29/78603 257/59 |
| 2009/0033643 | A1* | 2/2009 | Schmidt .................. G09G 3/20 345/205 |
| 2010/0203296 | A1 | 8/2010 | Tsai |
| 2014/0042398 | A1 | 2/2014 | Choi et al. |
| 2014/0065389 | A1 | 3/2014 | Loy et al. |
| 2014/0252317 | A1 | 9/2014 | Gupta et al. |
| 2014/0339517 | A1* | 11/2014 | Park .................... H01L 51/5253 257/40 |
| 2015/0179803 | A1* | 6/2015 | Yamazaki ........... H01L 29/7869 257/43 |

FOREIGN PATENT DOCUMENTS

| | | |
|---|---|---|
| CN | 103140953 A | 6/2013 |
| CN | 103474583 A | 12/2013 |
| CN | 103500745 A | 1/2014 |
| CN | 103531715 A | 1/2014 |
| CN | 203721730 U | 7/2014 |
| JP | 2010209353 A | 9/2010 |

OTHER PUBLICATIONS

English translation of Chinese Office Action dated Nov. 4, 2015, for corresponding Chinese Application No. 201410048621.7.

\* cited by examiner

FLEXIBLE DISPLAY SUBSTRATE AND METHOD FOR MANUFACTURING THE SAME

CROSS-REFERENCE TO RELATED APPLICATION

This application is a continuation application of U.S. patent application Ser. No. 14/436,725 filed on Apr. 17, 2015, which is a Section 371 National Stage Application of International Application No. PCT/CN2014/074216, filed on Mar. 27, 2014, entitled "Flexible Display Substrate and Method for Manufacturing the Same". The International Application claims the benefit of Chinese Patent Application No. 201410048621.7 filed on Feb. 11, 2014 in the State Intellectual Property Office of China, the whole disclosure of which is incorporated herein by reference in their entirety.

BACKGROUND OF THE INVENTION

Field of the Invention

Embodiments of the present invention generally relate to a display apparatus, in particular to a flexible display substrate for a display apparatus and a method for manufacturing the same.

Description of the Related Art

Flexible display technology has been rapidly developed in recent years, which lead to great progresses in a flexible display from a screen size to a display quality. Both a Cathode Ray Tube (CRT) and a Liquid Crystal Display (LCD) belong to a rigid display. Compared with the rigid display, a flexible display has many advantages such as impact resistance, shock resistance, light weight, small size, portability and the like.

A method for manufacturing the flexible display generally comprises forming a flexible base on a support substrate, and then further forming respective film layers constituting a display module on the flexible base. A method for manufacturing the flexible base is often divided into two types, one is to affix films on the support substrate such as a glass substrate, the other is to coat the films on the support substrate.

However, since a surface roughness of the flexible base is often greater than that of the glass substrate, in a case of bending, a break or peeling of the film layers disposed on the flexible base is easily occurred due to an uneven surface of the flexible base and stress factor.

In addition, during manufacturing the flexible display, the flexible base and the respective film layers will expands at a high temperature, and will shrink during the temperature is reduced from the high temperature to a room temperature. In this process, due to difference in expansion coefficients of the flexible base and the respective film layers, the flexible base will generally generate a greater deformation. Here, "a greater deformation" should be understood to be resulted from a greater stress. Therefore, when separating the flexible base from the support substrate, a warpage phenomenon is often occurred.

SUMMARY OF THE INVENTION

Embodiments of the present invention provide a flexible display substrate and a method for manufacturing the same, which may avoid break and peeling of film layers disposed on a flexible base and further reduce degree of a warpage generated by the flexible base when separating the support substrate and the flexible base located above the support substrate.

According to an aspect of embodiments of the present invention, there is provided a flexible display substrate comprising a flexible base, a first buffer layer and a second buffer layer disposed on an upper surface and a lower surface of the flexible base respectively, and a plurality of display modules disposed on the first buffer layer, each display module including at least one thin film transistor and at least one electrode corresponding to the thin film transistor.

In the flexible display substrate as described above, the first buffer layer and the second buffer layer are made of the same material and have the same thickness.

In the flexible display substrate as described above, any one of the first buffer layer and the second buffer layer includes at least one buffer film layer, and all the buffer film layers of the first buffer layer and all the buffer film layers of the second buffer layer are symmetrically disposed with respect to the flexible base, respectively.

In the flexible display substrate as described above, a thickness of each of the first buffer layer and the second buffer layer is between 1000 and 5000 Å.

In the flexible display substrate as described above, a plurality of auxiliary film layers are disposed on one side of the second buffer layer which is away from the flexible base, each of the auxiliary film layers being made of the same material and having the same thickness as each pattern layer of the thin film transistor.

In the flexible display substrate as described above, an arranging order of the plurality of auxiliary film layers is same as that of the respective pattern layers of the thin film transistor with respect to the flexible base.

In the flexible display substrate as described above, a plurality of auxiliary thin film transistors are disposed on one side of the second buffer layer which is away from the flexible base, the auxiliary thin film transistors corresponding to the thin film transistors one by one, respectively.

In the flexible display substrate as described above, the at least one electrode includes a cathode and an anode electrically connected with a drain electrode of the thin film transistor, and each of the display modules further includes a packaging layer and an organic material functional layer disposed between the cathode and the anode.

In the flexible display substrate as described above, the at least one electrode include a pixel electrode electrically connected with a drain electrode of the thin film transistor.

According another aspect of the embodiments of the present invention, there is provided a method for manufacturing a flexible display substrate comprising steps of: forming a second buffer layer on a support substrate; disposing a flexible base on the second buffer layer; forming a first buffer layer on the flexible base; forming a plurality of display modules on the first buffer layer, each of the plurality of display modules including at least one thin film transistor and at least one electrode corresponding to the thin film transistor, and separating the support substrate from the second buffer layer.

In the method as described above, the first buffer layer and the second buffer layer are formed under the same process condition.

In the method as described above, any one of the first buffer layer and the second buffer layer includes at least one buffer film layer, and all the buffer film layers of the first buffer layer and the second buffer layer are symmetrically disposed with respect to the flexible base, respectively.

The method as described above further comprises steps of: forming a plurality of auxiliary film layers between the second buffer layer and the support substrate, the auxiliary film layers being made of the same materials and having the same thicknesses as the pattern layers of the thin film transistor, respectively, and separating the support substrate from one of the plurality of auxiliary film layers in contact with the support substrate in the step of separating the support substrate from the second buffer layer.

In the method as described above, an arranging order of the plurality of auxiliary film layers is same as that of the respective pattern layer of the thin film transistor with respect to the flexible base.

The method as described above further comprises steps of: forming a plurality of auxiliary thin film transistors between the second buffer layer and the support substrate, the auxiliary thin film transistors corresponding to the thin film transistors one by one, respectively; and separating the support substrate from one of the plurality of auxiliary thin film transistors which is in contact with the support substrate in the step of separating the support substrate from the second buffer layer.

In the flexible display substrate and the method for manufacturing the same according to various embodiments of the present invention as described above, it is possible to cause strong adhesion forces to be generated between the first buffer layer and the flexible base as well as between the first buffer layer and the film layer located above the first buffer layer by forming the first buffer layer on the upper surface of the flexible base, thereby not only solving a problem that the surface of the flexible base is rough, but also avoiding the break and the peeling of the film layer on the flexible base.

Further, it is possible to counteract a part of stresses applied to the flexible base by the film layer located above the flexible base by forming the second buffer layer on the lower surface of the flexible base, so that the degree of the warpage occurred in the flexible base when separating the support substrate from the flexible base is reduced.

BRIEF DESCRIPTION OF THE DRAWINGS

In order to more apparently describe the embodiments of the present invention or the technical solution of the prior art, Figs. necessary for the embodiments or the prior art will be described simply hereinafter. Obviously, the described embodiments are merely part of the embodiments of the present invention, other embodiments may be acquired by the person skilled in the art based on the embodiments of the present invention without any inventive effort. The above and other features of the present invention will become more apparent by describing in detail exemplary embodiments thereof with reference to the accompanying drawings, in which.

DETAILED DESCRIPTION OF PREFERRED EMBODIMENTS OF THE INVENTION

In order to clearly and completely understand the technical solution of the present invention, exemplary embodiments of the present disclosure will be described hereinafter in detail with reference to the attached drawings. Obviously, the described embodiments are merely part of the embodiments of the present invention, rather than all of the embodiments of the present invention. Based on the embodiments of the present invention, other embodiments acquired by the person skilled in the art without any inventive effort will be within the protection scope of the present invention.

According to the general inventive concept of the present invention, there is provided a flexible display substrate comprising a flexible base, a first buffer layer and a second buffer layer disposed on an upper surface and a lower surface of the flexible base, respectively, and a plurality of display modules disposed on the first buffer layer, each of display modules includes at least one thin film transistor and at least one electrode corresponding to the thin film transistor.

A method for manufacturing a flexible display substrate according to exemplary embodiments of the present invention comprises steps of: providing a support substrate, forming a second buffer layer on the support substrate, disposing a flexible base on the second buffer layer, forming a first buffer layer on the flexible base, forming a plurality of display modules on the first buffer layer, each of the plurality of display modules including at least one thin film transistor and at least one electrode corresponding to the thin film transistor, and separating the support substrate from the second buffer layer so as to form the flexible display substrate.

In general, the thin film transistor includes a gate electrode, a gate insulating layer, an active layer, a source electrode and a drain electrode. In this case, the flexible display substrate further comprises a gate line electrically connected with the gate electrode, a gate line lead, a data line electrically connected with the source electrode and a data line lead.

It is noted that, firstly, in various embodiments of the present invention, each of the display modules may be understood to be a structure necessary for realizing a display function which is disposed on the flexible base and is formed by respective pattern layers.

Secondly, the at least one electrode may be different according to different types of the flexible display substrate. For example, when the flexible display substrate is used as an array substrate of a liquid crystal display (LCD), the at least one electrode includes a pixel electrode, and may also include a common electrode. In this case, each of display modules may include the thin film transistor and the pixel electrode electrically connected with the drain electrode of the thin film transistor, and may also include the common electrode and an interlayer insulating layer. When the flexible display substrate is used as an organic light-emitting diode (OLED) display substrate, the at least one electrode includes an anode and a cathode. In this case, each of the display modules may the thin film transistor, the anode electrically connected with the drain electrode of the thin film transistor and the cathode, and may also include an organic material functional layer interposed between the anode and the cathode. Here, due to particularity of a material of the organic material functional layer, it is necessary to form a packaging layer for packaging the organic material after forming the display modules as described above.

Thirdly, the thin film transistor is a semiconductor unit having switching characteristic. For example, the thin film transistor may be an amorphous silicon thin film transistor, or a low temperature polycrystalline silicon thin film transistor, or an oxide thin film transistor, or an organic thin film transistor and the like, and is not limited herein.

The thin film transistor may be a top-gate type or a bottom-gate type thin film transistor, and is not limited herein. The top-gate type and the bottom-gate type thin film transistors are defined based on positions of the gate electrode and the gate insulating layer, respectively. That is, with respect to the flexible base, when the gate electrode is disposed close to the flexible base and the gate insulating layer is disposed away from the flexible base, the thin film transistor may be referred to the bottom-gate type thin film transistor; when the gate electrode is disposed away from the flexible base and the gate insulating layer is disposed close the flexible base, the thin film transistor may be referred to the top-gate type thin film transistor.

Fourthly, in various embodiments of the present invention, the terms "above" and "below" are defined based on a manufacturing process sequence. In the process for manufacturing the flexible display substrate, components prior formed are located below, and components later formed are located above.

For example, the first buffer layer is located above the flexible base, and the second buffer layer is located below the flexible base. That is, the second buffer layer is prior formed, and then the flexible base, and finally the first buffer layer is formed, on the support substrate.

Fifthly, in various embodiments of the present invention, both the first buffer layer and the second buffer layer preferably are selected from such film layers that are not patterned unless otherwise statement.

In the method for manufacturing the flexible display substrate according to embodiments of the present invention, on one hand, it is possible to cause strong adhesion forces to be generated between the first buffer layer and the flexible base as well as between the first buffer layer and the film layer located above the first buffer layer by forming the first buffer layer on the upper surface of the flexible base, thereby not only solving a problem that the surface of the flexible base is rough, but also avoiding break and peeling of the film layer disposed on the flexible base; on the other hand, it is possible to counteract a part of stresses applied to the flexible base by the film layer located above the flexible base by forming the second buffer layer between the support substrate and the flexible base 102, so that the degree of the warpage occurred in the flexible base when separating the support substrate 101 from the flexible base 102 is reduced.

Figure 1:
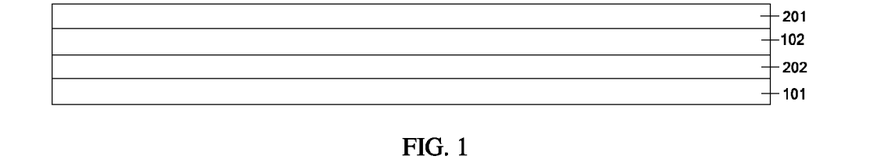
FIG. 1 is a schematic view showing a bonding manner of a flexible base and a support substrate in a process of manufacturing a flexible display substrate according to exemplary embodiments of the present invention.

According to an exemplary embodiment of the present invention, a method for manufacturing a flexible substrate comprises:

S01: forming a second buffer layer 202 on a support substrate 101, as shown in FIG. 1. The support substrate 101 may be a glass substrate. The second buffer layer 202 may have a single-layer or multilayer structure. A material for forming the second buffer layer 202 may be at least one of silicon nitride (SiN), silicon oxide (SiOx), Amorphous Silicon (A-Si), and Indium Tin Oxide (ITO).

S02: forming a flexible base 102 on the second buffer layer 202, as illustrated in FIG. 1. A material for forming the flexible base 102 may be at least one of polyimide, polycarbonate, polyacrylate, polyetherimide, polyethersulfone, Polyethylene terephthalate, and polyethylene naphthalate.

S03: forming a first buffer layer 201 on the flexible base 102, as shown in FIG. 1. A material for forming the first buffer layer 201 may be the same as that of the second buffer layer 202.

S04: forming a plurality of display modules on the first buffer layer 201, each of the plurality of display modules including at least one thin film transistor 30 and at least one electrode corresponding to the thin film transistor 30.

It will be appreciated for those skilled in the art that pattern layers such as a protection layer and a passivation layer necessary for realizing corresponding functions of the flexible display substrate may be further formed according to different types of the flexible display substrate expect for forming the at least one thin film transistor 30 and the at least one electrode.

A flexible display substrate and a method for manufacturing the same according to various exemplary embodiments of the present invention will be described below with reference to accompany drawings.

Figure 2:
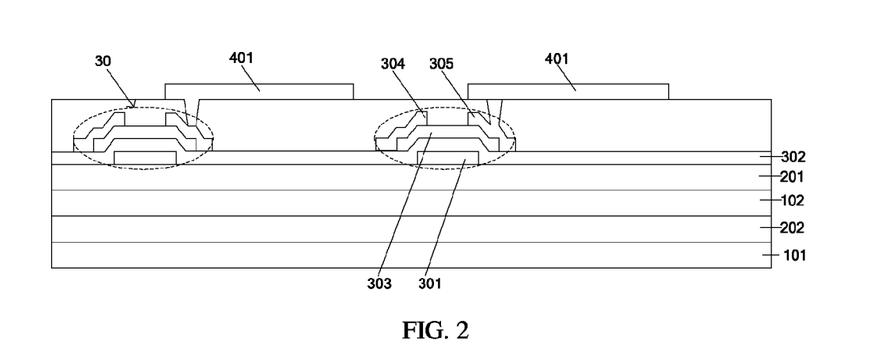
FIG. 2 is a schematic view showing a state in a process of manufacturing a flexible display substrate according to a first exemplary embodiment of the present invention.

FIG. 2 is a schematic view showing a state in a process for manufacturing a flexible display substrate according to a first exemplary embodiment of the present invention. As shown in FIG. 2, the at least one electrode includes a pixel electrode 401 which is electrically connected with a drain electrode 305 of the thin film transistor 30 through a via hole formed in a protection layer formed therebetween.

Figure 3:
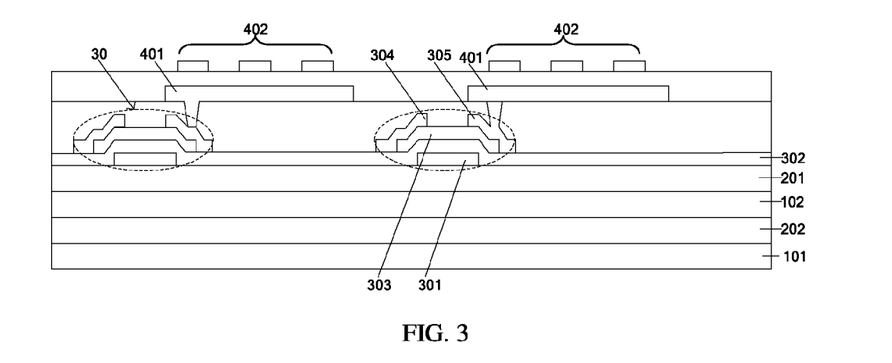
FIG. 3 is a schematic view showing a state in a process of manufacturing a flexible display substrate according to a second exemplary embodiment of the present invention.

FIG. 3 is a schematic view showing a state in a process for manufacturing a flexible display substrate according to a second exemplary embodiment of the present invention. The flexible display substrate according to the second exemplary embodiment as shown in FIG. 3 is obtained by further forming common electrodes 402 on the basis of the flexible display substrate according to the first exemplary embodiment as shown in FIG. 2. In this case, in the step S04, a gate metal layer including a gate electrode 301 and a gate line (not shown), a gate insulating layer 302, a semiconductor active layer 303, a source-drain metal layer including a source electrode 304, a drain electrode 305 and a data line (not shown), the pixel electrode 401 and the common electrodes 402 are sequentially formed on the first buffer layer 201. In the embodiment as shown in FIG. 3, the pixel electrode 401 and the common electrodes 402 are respectively formed on different layers with a passivation layer being formed therebetween.

Figure 4:
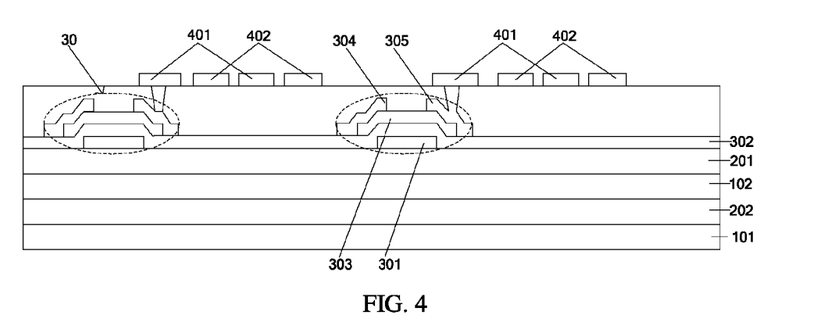
FIG. 4 is a schematic view showing a state in a process of manufacturing a flexible display substrate according to a third exemplary embodiment of the present invention.

FIG. 4 is a schematic view showing a state in a process for manufacturing a flexible display substrate according to a third exemplary embodiment of the present invention. The difference between the flexible display substrates as shown in FIG. 4 and that shown in FIG. 3 is in that the pixel electrode 401 is formed on the same layer as the common electrodes 402.

Figure 5:
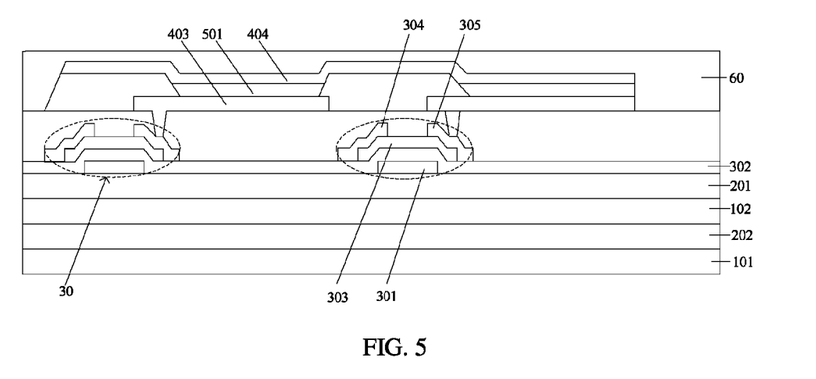
FIG. 5 is a schematic view showing a state in a process of manufacturing a flexible display substrate according to a fourth exemplary embodiment of the present invention.

FIG. 5 is a schematic view showing a state in a process for manufacturing a flexible display substrate according to a fourth exemplary embodiment of the present invention. The flexible display substrate according to the fourth exemplary embodiment as shown in FIG. 5 is a modification to that according to the first exemplary embodiment as shown in FIG. 2. As shown in FIG. 5, in the flexible display substrate according to the fourth exemplary embodiment, the at least one electrode further includes an anode 403 and a cathode 404. In this case, in the step S04, a gate metal layer including a gate electrode 301 and a gate line (not shown), a gate insulating layer 302, a semiconductor active layer 303, a source-drain metal layer including a source electrode 304, a drain electrode 305 and a data line (not shown), the anode 401, an organic material functional layer 501, the cathode 402 and a packaging layer 60 are sequentially formed on the first buffer layer 201. The anode 403 is electrically with the drain electrode 305 through a via hole in a protection layer formed therebetwwen.

The organic material functional layer 501 at least includes an electron transporting layer, a light-emitting layer and a hole transporting layer. In order to improve the efficiency of injecting electrons and holes into the light-emitting layer, the organic material functional layer may further include an electron injecting layer disposed between the cathode and the electron transporting layer and a hole injecting layer disposed between the anode and the hole transporting layer.

The method for manufacturing the flexible display substrate according to the exemplary embodiment of the present invention further comprises a step S05 of separating the support substrate 101 from a film layer in contact with the support substrate 101 to form various flexible display substrates as shown in FIGS. 6 through 9 after forming the display modules.

According to an exemplary embodiment of the present invention, the support substrate 101 is separated from the second buffer layer 202 in direct contact with support substrate 101 in a manner of laser radiation.

Further, both the first buffer layer 201 and the second buffer layer 202 include a single buffer film layer or a plurality of buffer film layers. That is, any one of the first buffer layer 201 and the second buffer layer 202 includes at least one buffer film layer.

In a case where both the first buffer layer 201 and the second buffer layer 202 include the plurality of buffer film layers, all the buffer film layers of the first buffer layer 201 and the second buffer layer 202 are symmetrically formed with respect to the flexible base 102.

For example, if the first buffer layer 201 includes a silicon oxide layer and a silicon nitride layer and the second buffer layer 202 includes a silicon oxide layer and a silicon nitride layer, then the first buffer layer 201 and the second buffer layer 202 are symmetrically disposed with respect to the flexible base 102. Specifically, the silicon oxide layer and the silicon nitride layer are firstly sequentially formed on the support substrate 101, and then the flexible base 102 is formed, thereafter, the silicon oxide layer and the silicon nitride layer are sequentially formed on the flexible base 102, wherein the two processes of forming the silicon oxide layer and the silicon nitride layer are completely the same as each other.

In this way, when the first buffer layer 201 and the second buffer layer 202 are symmetrically disposed with respect to the flexible base 102, it is possible to maximumly counteract stresses applied to the flexible base 102 by the first buffer layer 201 and the second buffer layer 202 and to reduce degree of a warpage occurred in the flexible base 102 when separating the support substrate 101 from the flexible base 102.

Further, it is possible to form the first buffer layer 201 and the second buffer layer 202 by the same process condition.

Here, a thickness of each of the first buffer layer 201 and the second buffer layer 202 is set, for example, between 1000 and 5000 Å.

Since the first buffer layer 201 and the second buffer layer 202 located above and below the flexible base 102 respectively are made of the same material, have the same thickness and structure, and the first buffer layer 201 and the second buffer layer 202 are symmetrically disposed with respect to the flexible base 102, it is possible to completely counteract the stresses applied to the flexible base 102 by the first buffer layer 201 and the second buffer layer 202.

Figure 12:
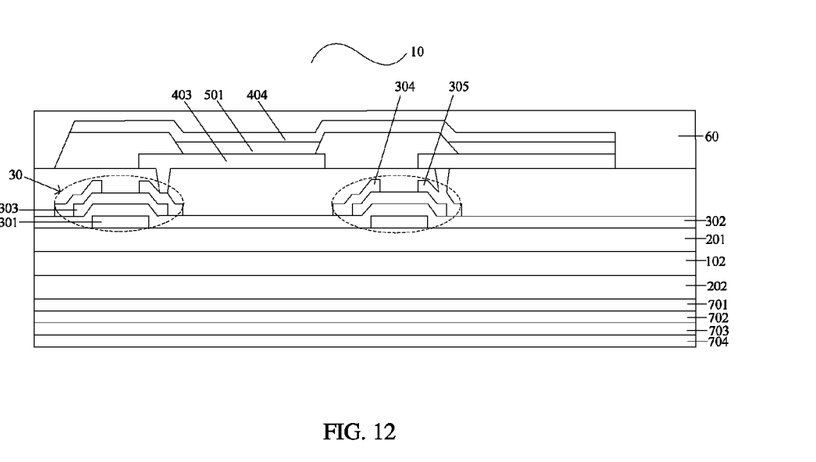
FIG. 12 is a schematic structural view of the flexible display substrate according to the fifth exemplary embodiment of the present invention.

Based on the above discussion, the method for manufacturing the flexible display substrate according the exemplary embodiments of the present invention further comprises a step of forming a plurality of auxiliary film layers between the second buffer layer 202 and the support substrate 101. Each of the plurality of auxiliary film layers is made of the same material and has the same thickness as each pattern layer of the thin film transistor 30. In a case of forming the plurality of auxiliary film layers, the support substrate 101 is separated from one of the plurality of auxiliary film layers which is in contact with the support substrate 101 in the step of separating the support substrate 101 from the second buffer layer 202. In this way, the plurality of auxiliary film layers are still remained on the second buffer layer 202 after separating, as shown in FIG. 12.

In this way, it is possible to counteract most of the stresses applied to the flexible base 102 by all the film layers located above the flexible base 102 by a combined action of the second buffer layer 202 and the plurality of auxiliary film layers located therebelow, thereby further reducing the degree of the warpage occurred in the flexible base 102 when separating the support substrate 101 from the flexible base 102.

Further, for the flexible base 102, it is possible to allow an order of forming the plurality of auxiliary film layers between the second buffer layer 202 and the support substrate 101 to be the same as that of arranging the respective pattern layer of the thin film transistor which are made of the same materials as the auxiliary film layers.

Figure 10:
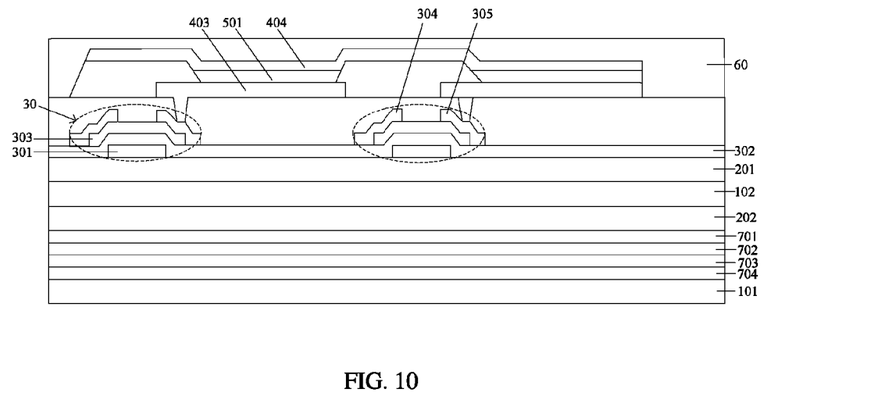
FIG. 10 is a schematic view showing a state in a process of manufacturing a flexible display substrate according to a fifth exemplary embodiment of the present invention.

FIG. 10 is a schematic view showing a state in a process for manufacturing a flexible display substrate according to a fifth exemplary embodiment of the present invention. The flexible display substrate according to the fifth exemplary embodiment as shown in FIG. 10 is a modification to that according to the fourth exemplary embodiment as shown in FIG. 5. As illustrated in FIG. 10, in a case where the patterns of the thin film transistor 30 sequentially include a gate metal layer, a gate insulating layer, a semiconductor active layer, and a source-drain metal layer, a plurality of auxiliary film layers are correspondingly formed between the second buffer layer 202 and the support substrate 101. The auxiliary film layers include a first film layer 701 made of the same material and having the same thickness as the gate metal layer, a second film layer 702 made of the same material and having the same thickness as the gate insulating layer, a third film layer 703 made of the same material and having the same thickness as the semiconductor active layer, and a fourth film layer 704 made of the same material and having the same thickness as the source-drain metal layer. That is, the fourth film layer 704, the third film layer 703, the second film layer 702, the first film layer 701 and the second buffer layer 202 are firstly sequentially formed on the support substrate 101, thereafter, the flexible base 102 is formed on the second buffer layer 202, and then the first buffer layer 201 is formed on the flexible base 102, and the gate metal layer, the gate insulating layer, the semiconductor active layer and the source-drain metal layer are sequentially formed on the first buffer layer 201.

Since the plurality of auxiliary film layers and the respective patter layers of the thin film transistor 30 are made of the same material and have the same thickness, and the arranging orders thereof with respect to the flexible base 102 are the same as each other i. e., the plurality of auxiliary film layers are symmetrically disposed with the respective pattern layers of the thin film transistor 30 with respect to the flexible base 102, it is possible to maximumly counteract the stresses applied to the flexible base 102 by all the film layers including the first buffer layer 201 and the thin film transistor 30 which are disposed above the flexible base 102 by the combined action of the second buffer layer 202 and the plurality of auxiliary film layers located therebelow.

Figure 11:
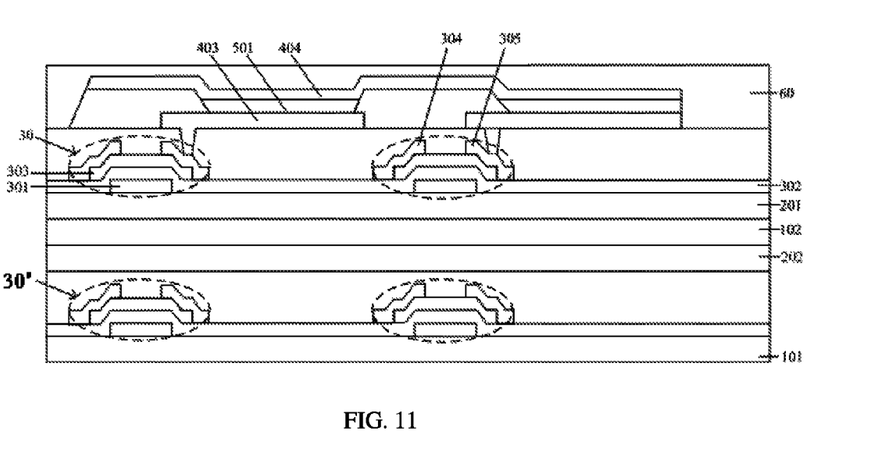
FIG. 11 is a schematic view showing a state in a process of manufacturing a flexible display substrate according to a sixth exemplary embodiment of the present invention.
Figure 13:
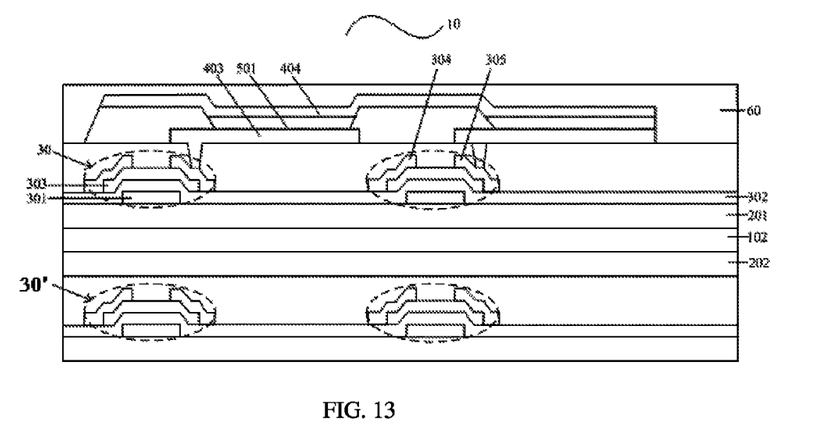
FIG. 13 is a schematic structural view of the flexible display substrate according to the sixth exemplary embodiment of the present invention.

FIG. 11 is a schematic view showing a state in a process for manufacturing a flexible display substrate according to a sixth exemplary embodiment of the present invention. The flexible display substrate according to the sixth exemplary embodiment as shown in FIG. 11 is a modification to that according to the fourth exemplary embodiment as shown in FIG. 5. The flexible display substrate as shown in FIG. 11 further comprise an auxiliary thin film transistor 30'. In an exemplary embodiment, as illustrated in FIG. 11, based on the method for manufacturing the flexible display substrate as shown in FIG. 5, the method further comprises a step of forming the auxiliary thin film transistor 30' between the second buffer layer 202 and the support substrate 101, the thin film transistors 30 formed above the first buffer layer 201 corresponding to the auxiliary thin film transistors 30' formed below the second buffer layer 202 one by one, respectively. In a case of forming a plurality of auxiliary thin film transistors 30', in the step of separating the support substrate 101 and the second buffer layer 202, the support substrate 101 is separated from a film layer of the plurality of auxiliary thin film transistors 30' which is in contact with the support substrate 101. In this way, after separating, the plurality of auxiliary thin film transistors 30' are still remained on the second buffer layer 202, as shown in FIG. 13.

Here, the expression "the thin film transistors 30 formed above the first buffer layer 201 corresponding to the auxiliary thin film transistors 30' formed below the second buffer layer 202 one by one, respectively" means any one of the thin film transistors 30 located above the first buffer layer 201 always corresponds to one of the auxiliary thin film transistors 30' located below the second buffer layer 201 in a vertical direction, and the film layers of the thin film transistors 30 formed above the first buffer layer 201 corresponds to the film layers of the auxiliary thin film transistors 30' formed below the second buffer layer 202 one by one, respectively.

In this way, it is possible to counteract the stresses applied to the flexible base 102 by the first buffer layer 201 and the thin film transistors 30 above the flexible base 102 by the combined action of the second buffer layer 202 and the auxiliary thin film transistors 30' located therebelow, thereby further reducing the degree of the warpage occurred in the flexible base 102 when separating the support substrate 101 from the flexible base 102.

It is noted that an auxiliary electrode film layer and an auxiliary display film layer may be further formed between the second buffer layer 202 and the support substrate 101 according to further exemplary embodiments of the present invention. The auxiliary electrode film layer is made of the same material and has the same thickness as the at least one electrode. The auxiliary display film layer is made of the same material and has the same thickness as other film layers necessary for the display modular.

According to further exemplary embodiments of the present invention, there is further provided a flexible display substrate 10. As illustrated in FIGS. 6 through 9, the flexible display substrate 10 comprises a flexible base 102, a first buffer layer 201 and a second buffer layer 202 disposed on an upper surface and a lower surface of the flexible base 102 respectively, and a plurality of display modules disposed on the first buffer layer 201, each of which includes at least one thin film transistor 30 and at least one electrode corresponding to the thin film transistor 30.

The thin film transistor 30 includes a gate electrode 301, a gate insulating layer 302, an active layer 303, a source electrode 304 and a drain electrode 305. In this case, the flexible display substrate 10 further comprises a gate line electrically connected with the gate electrode 301, a gate line lead, a data line electrically connected with the source electrode 304, and a data line lead.

Figure 6:
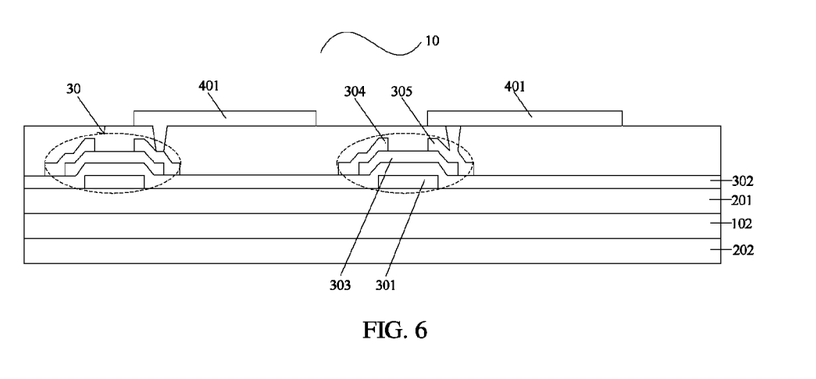
FIG. 6 is a schematic structural view of the flexible display substrate according to the first exemplary embodiment of the present invention.
Figure 7:
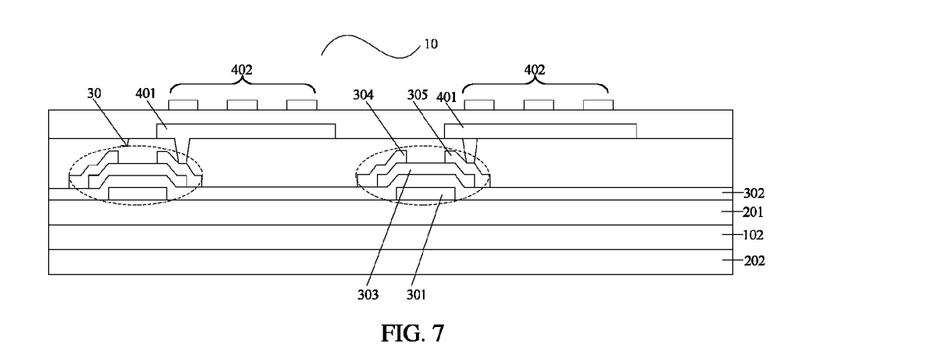
FIG. 7 is a schematic structural view of the flexible display substrate according to the second exemplary embodiment of the present invention.
Figure 8:
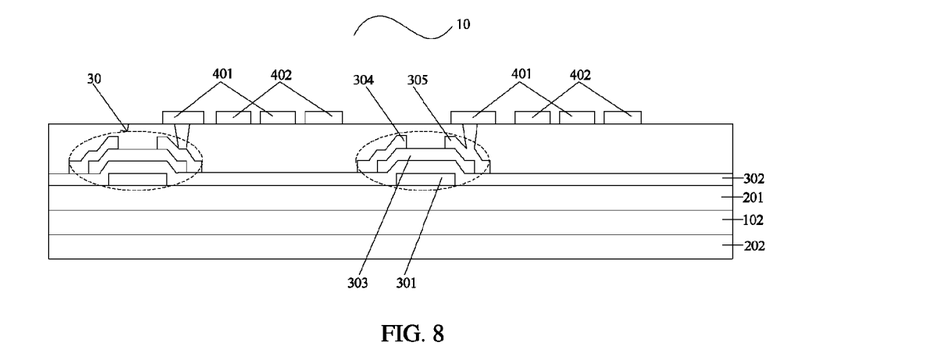
FIG. 8 is a schematic structural view of the flexible display substrate according to the third exemplary embodiment of the present invention.

When the flexible display substrate 10 is used as an array substrate of a liquid crystal display, the at least one electrode may include a pixel electrode 401 connected with the drain electrode 305, as shown in FIG. 6. The at least one electrode may further include a common electrode 402, as illustrated in FIGS. 7 and 8. In this case, for an In-Plane Switch (IPS) array substrate, as shown in FIG. 8, the pixel electrode 401 is disposed in the same layer as the common electrode 402 and spaced apart therefrom, and both the pixel electrode 401 and the common electrode 402 are provided as strip electrodes. For an Advanced-super Dimensional Switching (ADS) array substrate, as show in FIG. 7, the pixel electrode 401 is disposed in a different layer from the common electrode 402, and one of the pixel electrode 401 and the common electrode 402 located above is provided as a strip electrode, and the other of the pixel electrode 401 and the common electrode 402 located below is provided as a plate electrode.

Figure 9:
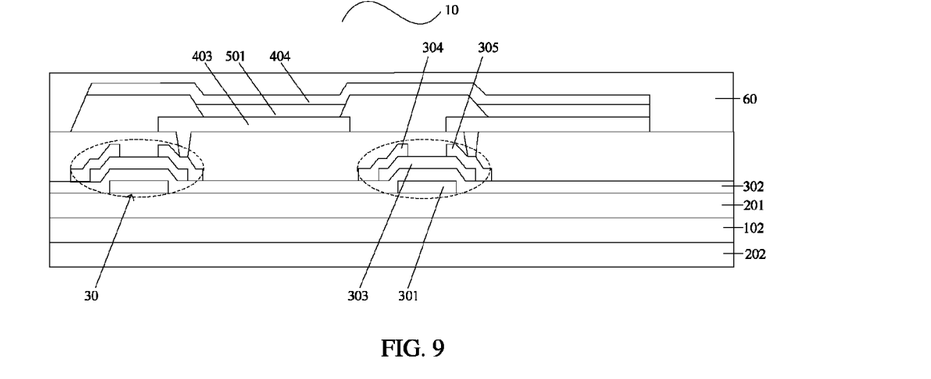
FIG. 9 is a schematic structural view of the flexible display substrate according to the fourth exemplary embodiment of the present invention.

When the flexible display substrate 10 is used as an organic light-emitting diode display substrate, the at least one electrode may include an anode 403 connected with the drain electrode 305 and a cathode 404, as shown in FIG. 9. In this case, each of the display modules further includes an organic material functional layer 501 interposed between the anode 403 and the cathode 404. Further, the flexible display substrate 10 further comprises a packaging layer 60.

Based on this, the flexible display substrate 10 may be divided into a single-side light emitting type flexible display substrate and a double-side light emitting type flexible substrate according to difference between the materials for forming the anode 403 and the cathode 404. That is, when the material for forming one of the anode 403 and the cathode 404 is an opaque material, the flexible display substrate is the single-side light emitting type flexible display substrate. When both the materials for forming the anode 403 and the cathode 404 are transparent materials, the flexible display substrate is the double-side light emitting type flexible display substrate.

The single-side light emitting flexible display substrate may be further divided into a top light emitting type flexible display substrate and a bottom light emitting type flexible display substrate according to the difference between the materials for forming the anode 403 and the cathode 404. Specifically, when the anode 403 is disposed close to the flexible base 102, the cathode 404 is disposed away from the flexible base 102, the material for forming the anode 403 is a transparent conductive material, if the material for forming the cathode 404 is an opaque conductive material, since a light is emitted out through one side of the flexible base 102 from the anode 403, the flexible display substrate may be referred as the bottom light emitting type flexible display substrate; if the material for forming the anode 403 is the opaque conductive material, and the material for forming the cathode 404 is the transparent conductive material, since the light is emitted out through the packaging layer 60 opposed to the flexible base 102 from the cathode 404, the flexible display substrate may be referred as the top light emitting type flexible display substrate. Of course, a relative position of the anode 403 and the cathode 404 may be reversed, and the description thereof in details is omitted herein.

Here, the packaging layer 60 may be a flexible packaging substrate, or may have one or more thin film layers. However, the packaging layer 60 may also have other packaging structures, and is not limited to herein.

For the double-side light emitting type flexible display substrate, when the anode 403 is disposed close to the flexible base 102, the cathode 404 is disposed away from the flexible base 102, both the materials for forming the anode 403 and the cathode 404 are transparent conductive materials such as Indium Tin Oxide (ITO), since the light, on one hand, is emitted out through one side of the flexible base 102 from the anode 403, and, on the other hand, is emitted out through the packaging layer opposed to the flexible base 102 from the cathode 404, the flexible display substrate may be referred as the double-side light emitting type flexible display substrate. Here, it is also possible to provide the anode 403 away from the flexible base 102 and to provide the cathode 404 close to the flexible base 102.

Based on the above discussion, each of the display modules may also comprise pattern layers necessary for realizing a display function, such as a protection layer, a passivation layer, an interlayer insulating layer, a pixel isolating layer for isolating pixel units, or additional pattern layers for improving the display effect or for overcoming some defects. However, when the flexible display substrate 10 is the OLED, each of the display modules should also comprise the organic material functional layer 501 located between the anode 403 and the cathode 404, and the packaging layer 60 for packaging the organic material functional layer 501.

Embodiments of the present invention provide a flexible display substrate 10 comprising a flexible base 102, a first buffer layer 201 and a second buffer layer 202 disposed on an upper surface and a lower surface of the flexible base 102, respectively, and a plurality of display modules disposed on the first buffer layer 201, each of which includes at least one thin film transistor 30 and at least one electrode corresponding to the thin film transistor 30.

On one hand, it is possible to cause strong adhesion forces to be generated between the first buffer layer 201 and the flexible base 102 as well as between the first buffer layer 201 and the film layer located above the first buffer layer 201 by forming the first buffer layer 201 on the upper surface of the flexible base 102, thereby not only solving a problem that the surface of the flexible base 102 is rough, but also avoiding break and peeling of the film layer provided on the flexible base 102.

On the other hand, it is possible to counteract a part of stresses applied to the flexible base 102 by the film layer located above the flexible base 102 by forming the second buffer layer 202 between the support substrate 101 and the flexible base 102, so that the degree of the warpage occurred in the flexible base 102 when separating the support substrate 101 from the flexible base 102 is reduced.

Preferably, the first buffer layer 201 is made of the same material and has the same thickness as the second buffer layer 202.

Since the first buffer layer 201 and the second buffer layer 202 located above and below the flexible base 102, respectively, are made of the same material and have the same thickness and structure, it is possible to maximumly counteract stresses applied to the flexible base 102 by the first buffer layer 201 and the second buffer layer 202 and to reduce the degree of the warpage occurred in the flexible base 102 when separating the support substrate 101 from the flexible base 102.

Further, both the first buffer layer 201 and the second buffer layer 202 include a single film layer or a plurality of film layers. In a case where both the first buffer layer 201 and the second buffer layer 202 include the plurality of film layers, all the film layer of the first buffer layer 201 and the second buffer layer 202 are symmetrically disposed with respect to the flexible base 102.

For example, if the first buffer layer 201 includes a silicon oxide layer and a silicon nitride layer and the second buffer layer 202 includes a silicon oxide layer and a silicon nitride layer, then the first buffer layer 201 and the second buffer layer 202 are symmetrically disposed with respect to the flexible base 102. That is, the silicon oxide layer of the first buffer layer 201 and the silicon oxide layer of the second buffer layer 202 are both disposed close to the flexible base 102, and the silicon nitride layer of the first buffer layer 201 and the silicon nitride layer of the second buffer layer 202 are both disposed away from the flexible base 102.

In this way, when the first buffer layer 201 and the second buffer layer 202 are completely symmetrically disposed with respect to the flexible base 102, it is possible to completely counteract the stresses applied to the flexible base 102 by the first buffer layer 201 and the second buffer layer 202.

Further, considering an entire thickness of the flexile display substrate 10, in embodiments of the present invention, the thickness of each of the first buffer layer 201 and the second buffer layer 202 may be between 1000 and 5000 Å.

Based on the above discussion, preferably, a plurality of auxiliary film layers are further disposed on one side of the second buffer layer 202 away from the flexible substrate 102. Each of the auxiliary film layers is made of the same material and has the same thickness as each pattern layer made of the thin film transistor 30.

In this way, it is possible to counteract most of the stresses applied to the flexible base 102 by all the film layers located above the flexible base 102 by a combined action of the second buffer layer 202 and the plurality of auxiliary film layers located below the second buffer layer 202, thereby further reducing the degree of the warpage occurred in the flexible base 102 when separating the support substrate 101 from the flexible base 102.

Further preferably, an arranging order of the plurality of auxiliary film layers is same as that of the respective pattern layers of the thin film transistor 30 with respect to the flexible base 102.

For example, as shown in FIG. 12, in a case where the pattern layers for forming the thin film transistor 30 sequentially include a gate metal layer, a gate insulating layer, a semiconductor active layer, a source-drain metal layer, the plurality of auxiliary film layers formed on the one side of the second buffer layer 202 away from the flexible substrate 102 include a first film layer 701 made of the same material and having the same thickness as the gate metal layer, a second film layer 702 made of the same material and having the same thickness as the gate insulating layer, a third film layer 703 made of the same material and having the same thickness as the semiconductor active layer, and a fourth film layer 704 made of the same material and having the same thickness as the source-drain metal layer. That is, with respect to the flexible base 102, the gate metal layer, the gate insulating layer, the semiconductor layer and the source-drain metal layer located above the flexible base 102 are sequentially disposed away from the flexible base 102, and the first film layer 701, the second film layer 702, the third film layer 703 and the fourth film layer 704 located below the flexible base 102 are sequentially disposed away from the flexible base 102

Since the thin film transistors 30 and the plurality of auxiliary film layers are made of the same material and have the same thickness, and the arranging orders thereof with respect to the flexible base 102 are the same as each other, i.e., it may be understood that the thin film transistors 30 and the plurality of auxiliary film layers are symmetrically disposed with respect to the flexible base 102, it is possible to maximumly counteract the stresses applied to the flexible base 102 by all the film layers including the first buffer layer 201 and the thin film transistors 30 which are disposed above the flexible base 102, by the combined action of the second buffer layer 202 and the plurality of auxiliary film layers located therebelow.

Alternatively, as illustrated in FIG. 13, the auxiliary thin film transistors 30' are further disposed on one side of the second buffer layer 202 which are away from the flexible base 102, and the thin film transistors 30 formed above the first buffer layer 201 corresponds to the auxiliary thin film transistors 30' formed below the second buffer layer 202 one by one, respectively.

It should be noted that the expression "the thin film transistors 30 formed above the first buffer layer 201 corresponds to the auxiliary thin film transistors 30' formed below the second buffer layer 202 one by one, respectively" means any one of the thin film transistors 30 located above the first buffer layer 201 always corresponds to one of the auxiliary thin film transistors 30' located below the second buffer layer 201 in a vertical direction, and the film layers of the thin film transistors 30 located above the first buffer layer 201 corresponds to the film layers of the auxiliary thin film transistors 30' located below the second buffer layer 202 one by one, respectively.

In this way, it is possible to counteract the stresses applied to the flexible base 102 by the first buffer layer 201 and thin film transistors 30 above the flexible base 102 by the combined action of the second buffer layer 202 and the auxiliary thin film transistors 30' located therebelow, thereby further reducing the degree of the warpage occurred in the flexible base 102 when separating the support substrate 101 and the flexible base 102.

It is noted that an auxiliary electrode film layer and an auxiliary display film layer may be further formed between the second buffer layer 202 and the support substrate 101 according to further exemplary embodiments of the present invention. The auxiliary electrode film layer is made of the same material and has the same thickness as the at least one electrode. The auxiliary display film layer is made of the same material and has the same thickness as other film layers necessary for the display modular.

Moreover, it should be appreciated for those skilled in the art that a bottom-gate type thin film transistor is illustrated as an example in all the accompany drawings of the embodiments of the present invention. The present invention, however, is not limited to herein, and the thin film transistor may any type thin film transistor.

Although several exemplary embodiments have been shown and described above, the present invention is not limited herein, and it would be appreciated by those skilled in the art that various changes or modifications may be made in these embodiments without departing from the principle and spirit of the disclosure, the scope of which is defined in the claims and their equivalents.

What is claimed is:
1. A flexible display substrate comprising:
   a flexible base;
   a first buffer layer and a second buffer layer disposed on an upper surface and a lower surface of the flexible base, respectively;
   a plurality of display modules disposed on the first buffer layer, each display module including at least one thin film transistor and at least one electrode corresponding to the thin film transistor; and
   a plurality of auxiliary thin film transistors disposed on one side of the second buffer layer which is away from the flexible base, the auxiliary thin film transistors corresponding to the thin film transistors one by one, respectively;
   wherein the film layers of the thin film transistors correspond to the film layers of the auxiliary thin film transistors one by one, respectively, so that stress applied to the flexible base by the first buffer layer and the thin film transistors is counteracted by combined action of the second buffer layer and the auxiliary thin film transistors.

2. The flexible display substrate according to claim 1, wherein
   the at least one electrode includes a cathode, and an anode electrically connected with a drain electrode of the thin film transistor; and
   each of the display modules further includes a packaging layer, and an organic material functional layer disposed between the cathode and the anode.

3. The flexible display substrate according to claim 1, wherein
   the at least one electrode include a pixel electrode electrically connected with a drain electrode of the thin film transistor.

4. The flexible display substrate according to claim 1, wherein the first buffer layer and the second buffer layer are made of the same material and have the same thickness.

5. The flexible display substrate according to claim 4, wherein
   any one of the first buffer layer and the second buffer layer includes at least one buffer film layer; and
   all the buffer film layers of the first buffer layer and all the buffer film layers of the second buffer layer are symmetrically disposed with respect to the flexible base, respectively.

6. The flexible display substrate according to claim 4, wherein a thickness of each of the first buffer layer and the second buffer layer is set between 1000 and 5000 Å.

7. A method for manufacturing a flexible display substrate comprising steps of:
   forming a second buffer layer on a support substrate;
   providing a flexible base on the second buffer layer;
   forming a first buffer layer on the flexible base;
   forming a plurality of display modules on the first buffer layer, each of the plurality of display modules including at least one thin film transistor and at least one electrode corresponding to the thin film transistor; and
   separating the support substrate from one of the plurality of auxiliary thin film transistors which is in contact with the support substrate,
   wherein the step of forming a second buffer layer on a support substrate comprises a step of:
   forming a plurality of auxiliary thin film transistors between the second buffer layer and the support substrate, the auxiliary thin film transistors corresponding to the thin film transistors one by one, respectively.

8. The method according to claim 7, wherein the first buffer layer and the second buffer layer are formed under the same process condition.

9. The method according to claim 7, wherein
   any one of the first buffer layer and the second buffer layer includes at least one buffer film layer; and
   all the buffer film layers of the first buffer layer and all the buffer film layers of the second buffer layer are symmetrically disposed with respect to the flexible base, respectively.

* * * * *